United States Patent
Zheng

(10) Patent No.: US 9,425,068 B2
(45) Date of Patent: Aug. 23, 2016

(54) SEMICONDUCTOR DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventor: Chao Zheng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/738,513

(22) Filed: Jun. 12, 2015

(65) Prior Publication Data

US 2016/0035589 A1    Feb. 4, 2016

(30) Foreign Application Priority Data

Jul. 30, 2014    (CN) .......................... 2014 1 0370709

(51) Int. Cl.
| | |
|---|---|
| *H01L 23/04* | (2006.01) |
| *H01L 23/06* | (2006.01) |
| *H01L 23/26* | (2006.01) |
| *H01L 21/54* | (2006.01) |
| *H01L 21/50* | (2006.01) |

(52) U.S. Cl.
CPC ................ *H01L 21/54* (2013.01); *H01L 21/50* (2013.01); *H01L 23/26* (2013.01); *H01L 2924/1461* (2013.01); *H01L 2924/1615* (2013.01); *H01L 2924/16251* (2013.01)

(58) Field of Classification Search
CPC . H01L 23/04; H01L 23/26; H01L 2924/1461; H01L 2924/15; H01L 2924/151; H01L 2924/1511; H01L 2924/00; H01L 21/50; H01L 21/54; H01L 21/02019; H01L 21/042; H01L 21/31055; H01L 2924/16251; H01L 21/76286
See application file for complete search history.

(56) References Cited

U.S. PATENT DOCUMENTS

| | | | | |
|---|---|---|---|---|
| 2010/0025845 | A1* | 2/2010 | Merz | ..................... B81B 7/0038 |
| | | | | 257/723 |
| 2013/0105959 | A1* | 5/2013 | Baillin | ................ B81C 1/00285 |
| | | | | 257/682 |

* cited by examiner

*Primary Examiner* — Jasmine Clark
(74) *Attorney, Agent, or Firm* — Innovation Counsel LLP

(57) ABSTRACT

A method for manufacturing semiconductor device may include the following steps: performing an etching process to remove a sacrificial layer from a first composite structure, wherein the first composite structure includes a first substrate structure; performing a heat treatment to release a gas from the first composite structure; performing a cleaning process to remove an oxide layer from the first composite structure; and combining the first composite structure with a second composite structure that includes a second substrate structure and an electronic component positioned on the second substrate substructure, such that the first substrate structure is combined with the second substrate structure to form an enclosure structure that encloses the electronic component.

18 Claims, 5 Drawing Sheets

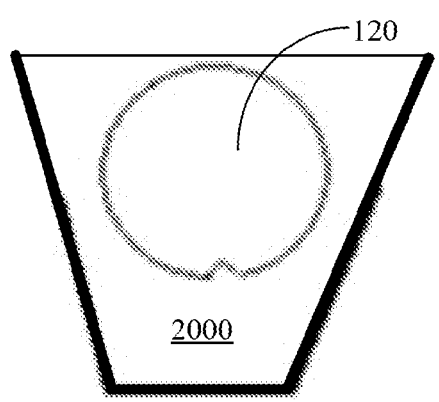
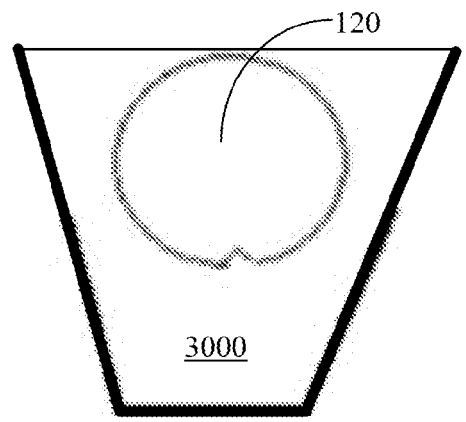
FIG. 2  FIG. 3
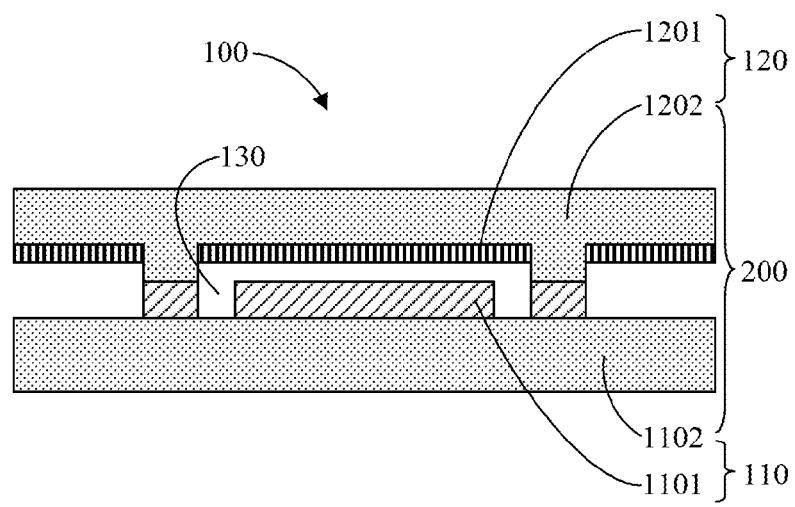
FIG. 4

SEMICONDUCTOR DEVICE, RELATED MANUFACTURING METHOD, AND RELATED ELECTRONIC DEVICE

CROSS-REFERENCE TO RELATED APPLICATION

This application claims priority to and benefit of Chinese Patent Application No. 201410370709.0, filed on 30 Jul. 2014; the Chinese Patent Application is incorporated herein by reference in its entirety.

BACKGROUND OF THE INVENTION

The present invention is related to a semiconductor device, a method for manufacturing the semiconductor device, and an electronic device that includes the semiconductor device.

A semiconductor device may include a component that needs to operate with minimum interference from gas molecules. For example, the component may be a microelectromechanical systems (MEMS) component. In order to maintain a suitable operating environment for the component, the semiconductor device may include an enclosure structure for accommodating the component, and a getter may be implemented inside the enclosure structure for absorbing gas molecules that may emerge inside the enclosure structure.

If gas molecules inside the enclosure structure are more than the getter can effectively absorb, some gas molecules may significantly interfere with the component, and the performance of the component may be unsatisfactory. As a result, the quality of the semiconductor device and the related manufacturing yield may be unsatisfactory.

SUMMARY

An embodiment of the present invention may be related to a method for manufacturing a semiconductor device. The method may include the following steps: performing an etching process to remove a sacrificial layer from a first composite structure, wherein the first composite structure may include a first substrate structure; performing a heat treatment to release a gas from the first composite structure; performing a cleaning process to remove an oxide layer from the first composite structure; and combining the first composite structure with a second composite structure that may include a second substrate structure and an electronic component positioned on the second substrate substructure, such that the first substrate structure may be combined with the second substrate structure to form an enclosure structure that has a cavity, and such that the electronic component may be positioned inside the cavity.

The heat treatment may be performed after the etching process.

The heat treatment may be performed before the cleaning process.

The heat treatment may be performed at a temperature in a range of 280 degrees Celsius to 320 degrees Celsius.

The heat treatment may be performed at 300 degrees Celsius.

The heat treatment may be performed at a temperature that enables a quality factor value of the semiconductor device to be greater than or equal to 18000.

The heat treatment may be performed for a time length in a range of 15 hours to 25 hours.

The heat treatment may be performed for 20 hours.

The heat treatment may be performed for a time length that enables a quality factor value of the semiconductor device to be greater than or equal to 18000.

The method may include the following steps: positioning the first composite structure inside a container (e.g., a heating chamber or a tube furnace) to perform the heat treatment; and extracting the gas from the container during the heat treatment. A pressure inside the container may be less than 100 kPa, e.g. less than 3 kPa, before the first composite structure is positioned inside the container.

The method may include the following step: removing the first composite structure from the container after the heat treatment. A pressure inside the container may be less than 100 kPa, e.g. less than 3 kPa, before the first composite structure is removed from the container. A pressure inside the container may be less than 100 kPa, e.g. less than 3 kPa, when the first composite structure is (being) removed from the container.

The method may include the following steps: positioning the first composite structure in a container to perform the heat treatment; and extracting hydroxide molecules from the container during the heat treatment, wherein the gas may include the hydroxide molecules.

The method may include the following steps: positioning the first composite structure in a container to perform the heat treatment; and extracting nitrogen molecules from the container during the heat treatment, wherein the gas may include the nitrogen molecules.

The method may include the following steps: positioning the first composite structure in a container to perform the heat treatment; and extracting hydrogen molecules from the container during the heat treatment, wherein the gas may include the hydrogen molecules.

The method may include the following steps: positioning the first composite structure in a container to perform the heat treatment; and extracting water molecules from the container during the heat treatment, wherein the gas may include the water molecules.

The first composite structure may include a getter positioned on the first substrate structure and configured for absorbing gas molecules. The heat treatment may be performed on both the getter and the first substrate structure. The getter may overlap the electronic component after the enclosure structure has been formed.

The first composite structure may include a titanium member positioned on the first substrate structure. The heat treatment may be performed on both the titanium member and the first substrate structure. The titanium member overlaps the electronic component after the enclosure structure has been formed.

An embodiment of the present invention may be related to a semiconductor device. The semiconductor device may include the following elements: an enclosure structure; a getter positioned inside the enclosure structure and configured to absorb gas molecules; and an electronic component positioned inside the enclosure structure and overlapping the getter. A quality factor value (i.e., Q factor value) of the semiconductor device may be greater than or equal to 18000.

An embodiment of the present invention may be related to an electronic device. The electronic device may include the following elements: an electronic component; and a semiconductor device electrically connected to the electronic component. The semiconductor device may include the following elements: an enclosure structure; a getter positioned inside the enclosure structure and configured to absorb gas molecules; and an electromechanical component positioned inside the enclosure structure and overlapping the getter. A quality factor value (i.e., Q factor value) of the semiconductor device may be greater than or equal to 18000.

According to embodiments of the invention, a heat treatment process may effectively reduce the amounts of gas molecules potentially released into operating environments of electronic components (e.g., microelectromechanical systems components) in semiconductor devices. Therefore, satisfactory performance of the electronic components may be attained. Advantageously, satisfactory quality of the semiconductor devices and a satisfactory yield of the related manufacturing process may be substantially attained.

The above summary is related to some of many embodiments of the invention disclosed herein and is not intended to limit the scope of the invention.

BRIEF DESCRIPTION OF THE DRAWINGS

FIG. 2, FIG. 3, and FIG. 4 show schematic diagrams that illustrate steps performed in a method for manufacturing a semiconductor device in accordance with one or more embodiments of the present invention.

DETAILED DESCRIPTION

Figure 1:
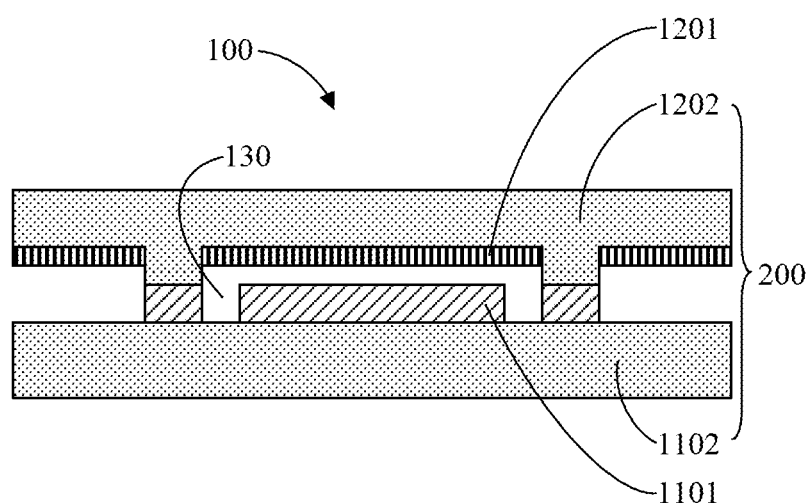
FIG. 1 shows a schematic diagram (e.g., a schematic cross-sectional view) that illustrates elements and/or structures in a semiconductor device in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 1 shows a schematic diagram (e.g., a schematic cross-sectional view) that illustrates elements and/or structures in a semiconductor device 100 in accordance with one or more embodiments of the present invention.

The semiconductor device 100 may include the following elements: an enclosure structure 200 that includes a substrate structure 1202 and a substrate structure 1102; a getter 1201 positioned inside a cavity 130 of the enclosure structure 200 to absorb gas molecules, for maintaining substantial vacuum inside the cavity 130; and an electronic component 1101 positioned inside the enclosure structure 200 and overlapping the getter 1201.

Each of the substrate structure 1202 and the substrate structure 1201 may include a semiconductor substrate member and may include one or more other elements positioned on and/or in the semiconductor substrate member. The getter 1201 may be positioned on the substrate structure 1202 and may be formed of one or more of titanium, etc. The electronic component 1101 may be, for example, an electromechanical component or a microelectromechanical systems (MEMS) component positioned on the substrate structure 1102 and may overlap the getter 1201 in a direction perpendicular to the getter 1201.

The substrate structure 1202, the substrate structure 1102, the getter 1201, and the electronic component 1101 may not provide a significant amount of gas molecules into the cavity 130; the getter 1201 may effectively absorb gas molecules inside the cavity 130. Therefore, the cavity 130 may contain a minimum amount of gas molecules, such that satisfactory performance of the electronic component 1101 may be achieved, and a quality factor value (i.e., Q factor value) of the semiconductor device 100 may be greater than or equal to 18000, e.g., about 18700. Advantageously, satisfactory performance of the semiconductor device 100 and a satisfactory yield of a manufacturing process related to the semiconductor device 100 may be attained.

FIG. 2, FIG. 3, and FIG. 4 show schematic diagrams that illustrate steps performed in a method for manufacturing the semiconductor device 100 in accordance with one or more embodiments of the present invention. FIG. 5, FIG. 6, FIG. 7, and FIG. 8 show schematic diagrams that illustrate steps performed in a method for manufacturing the semiconductor device 100 in accordance with one or more embodiments of the present invention. FIG. 9 shows a flowchart that illustrates steps in a method for manufacturing the semiconductor device 100 in accordance with one or more embodiments of the present invention.

Referring to FIG. 9, FIG. 2, FIG. 5, FIG. 3, FIG. 7, FIG. 4, and FIG. 8, the method may include steps 901, 903, and 904. Referring to FIG. 9 and FIG. 6, the method may include a step 902.

Figures 5, 6, 7:
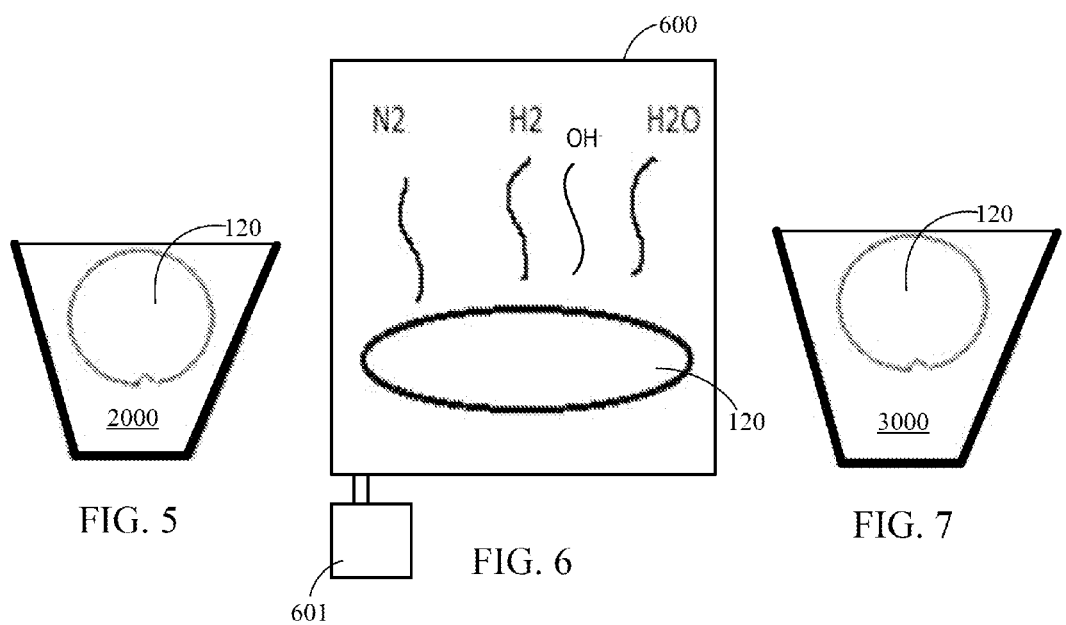
FIG. 5, FIG. 6, FIG. 7, and FIG. 8 show schematic diagrams that illustrate steps performed in a method for manufacturing a semiconductor device in accordance with one or more embodiments of the present invention.

Referring to FIG. 9, FIG. 2, and FIG. 5, the step 901 may include performing an etching process, using an etchant 2000, to remove a sacrificial layer from a composite structure 120. The composite structure 120 may include the substrate structure 1202 and the getter 1201. The etchant 2000 may include/be hydrogen peroxide ($H_2O_2$).

Referring to FIG. 9, FIG. 3, and FIG. 7, subsequent to step 901, the step 903 may include performing a cleaning process, using a cleaning agent 3000, to remove an oxide layer from the composite structure 120. The cleaning agent 3000 may include/be a dilute hydrofluoric acid (DHF) solution.

Figure 8:
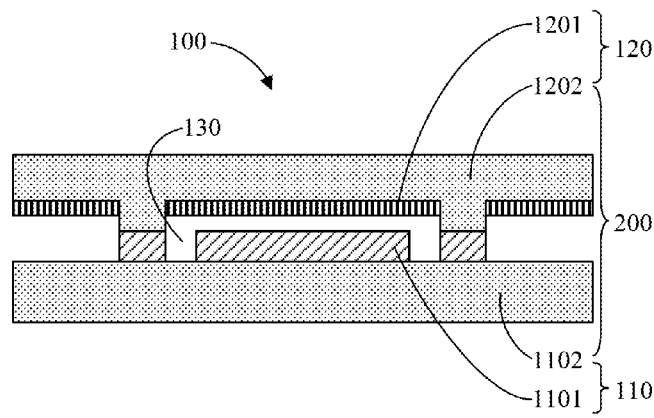
Figure 9:
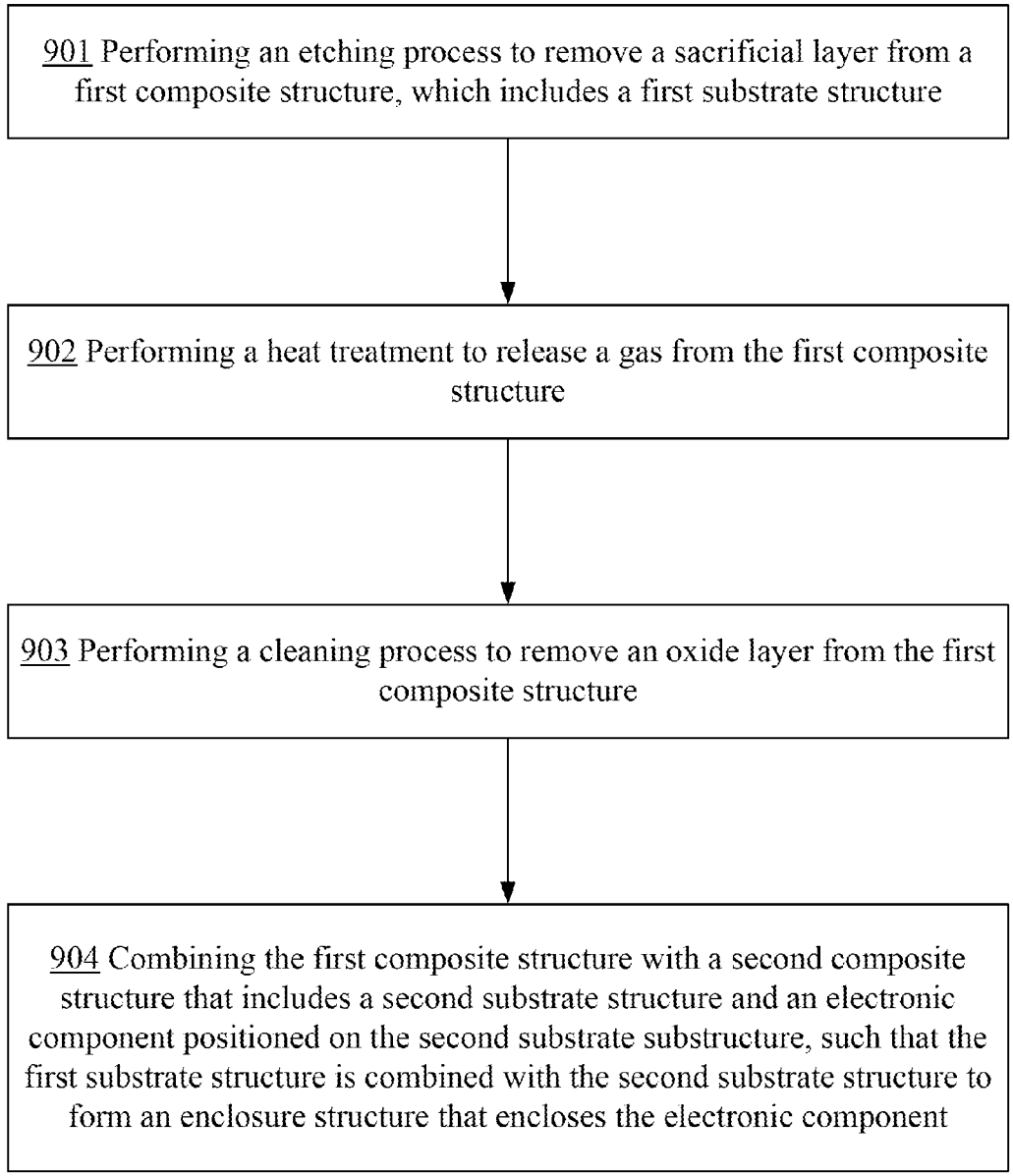
FIG. 9 shows a flowchart that illustrates steps in a method for manufacturing a semiconductor device in accordance with one or more embodiments of the present invention.

Referring to FIG. 9, FIG. 4, and FIG. 8, subsequent to the step 903, the step 904 may include combining (i.e., bonding) the composite structure 120 with a composite structure 110, which may include the substrate structure 1102 and the electronic component 1101, such that the substrate structure 1202 may be combined with the substrate structure 1102 to form the enclosure structure 200 having the cavity 130, and such that the electronic component 1101 may be positioned (and enclosed) inside the cavity 130. The semiconductor device 100 may include the enclosure structure 200 and the elements enclosed inside the enclosure structure 200.

For achieving satisfactory performance of the electronic component 1101, the amount of gas molecules inside the cavity 130 may need to be minimized. The method may include one or more additional steps for minimizing the amount of gas molecules inside the cavity 130.

Referring to FIG. 9 and FIG. 6, the method may include a step 902 performed before the step 904. The step 902 may include performing a heat treatment to release a gas from the composite structure 120, for minimizing the amount of gas molecules potentially provided into the cavity 130, which may be formed in the step 904. The gas may have been formed and/or trapped in the composite structure 120 as a result of the step 901.

The step 902 may be performed after the step 901, i.e., the heat treatment may be performed after the etching process. The step 902 may be performed before the step 903, i.e., the heat treatment may be performed before the cleaning process.

The heat treatment may be performed at a temperature that enables a quality factor value of the semiconductor device 100 to be greater than or equal to 18000, e.g., about 18700. In an embodiment, the heat treatment may be performed at a temperature in a range of 280 degrees Celsius to 320 degrees Celsius. In an embodiment, the heat treatment may be performed at 300 degrees Celsius.

The heat treatment may be performed for a time length that enables a quality factor value of the semiconductor device 100 to be greater than or equal to 18000, e.g., about 18700. In an embodiment, the heat treatment may be performed for a time length in a range of 15 hours to 25 hours. In an embodiment, the heat treatment may be performed for 20 hours.

The step 902 may include the following sub-steps: positioning the composite structure 120 inside a container 600 (e.g., a heating chamber or a tube furnace) to perform the heat treatment for the composite structure 120 to release the gas; and extracting, e.g., using a pump 601, the gas from the container 600 during the heat treatment. For efficient extraction of the gas, a pressure inside the container 600 may be less than 100 kPa, e.g. in a range of 3 kPa to 50 kPa, before the composite structure 120 is positioned inside the container 600.

The step 902 may include the following sub-step: removing the composite structure 120 from the container 600 after the heat treatment. The gas may be substantially extracted (or removed) from the container 600, such that a pressure inside the container may be less than 100 kPa, e.g. in a range of 3 kPa to 50 kPa, before the composite structure 120 is removed from the container 600 and/or when the composite structure 120 is (being) removed from the container 600.

The step 902 may include extracting hydroxide ($HO^-$) molecules from the container 600 during the heat treatment, wherein the gas may include the hydroxide molecules.

The step 902 may include the extracting nitrogen ($N_2$) molecules from the container 600 during the heat treatment, wherein the gas may include the nitrogen molecules.

The step 902 may include extracting hydrogen ($H_2$) molecules from the container 600 during the heat treatment, wherein the gas may include the hydrogen molecules.

The step 902 may include extracting water ($H_2O$) molecules from the container 600 during the heat treatment, wherein the gas may include the water molecules.

The heat treatment may be performed on both the getter 1201 (e.g., a titanium member) and the substrate structure 1202.

In an embodiment, the composite structure 120 may include the substrate structure 1202 without including a getter, and the heat treatment may be performed on the substrate structure 1202 without being performed on a getter.

In an embodiment, the composite structure 110 may include multiple electronic component sets, and multiple cavities that respectively accommodate the electronic component sets may be formed in the enclosure structure 200 as a result of the combination of the structure 120 with the composite structure 110. The method may include dicing (or cutting) the enclosure structure to produce multiple semiconductor devices.

According to embodiments of the invention, a heat treatment process may reduce the amount of gas molecules retained in the composite structure 120 before the step 904 (i.e., the substrate combination/bonding step). Therefore, embodiments of the invention may minimize the amount of gas molecules potentially released from at least the getter 1201 and/or the substrate structure 1202 into the cavity 130, where the electronic component 1101 operates. As a result, the cavity 130 may contain a minimum amount of gas molecules, such that satisfactory performance of the electronic component 1101 may be achieved. Advantageously, satisfactory performance of the semiconductor device 100 and a satisfactory yield of a manufacturing process related to the semiconductor device 100 may be attained.

Figure 10:
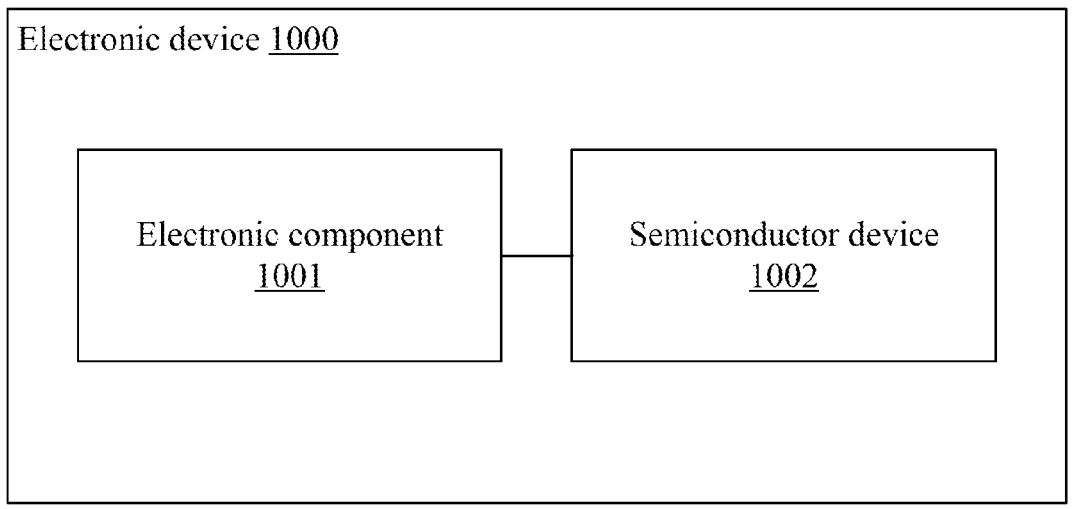
FIG. 10 shows a schematic block diagram that illustrates elements in an electronic device in accordance with one or more embodiments of the present invention.

FIG. 10 shows a schematic block diagram that illustrates elements in an electronic device 1000 in accordance with one or more embodiments of the present invention. The electronic device 1000 may include an electronic component 1001 and a semiconductor device 1002 that is electrically connected to the electronic component 1001. The semiconductor device 1002 may have one or more of the above-discussed features and advantages.

In an embodiment, the electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device may be or may include an intermediate product (e.g., a mobile phone main board) or module including a semiconductor device that may have one or more of the features and advantages discussed above.

According to embodiments of the invention, a heat treatment process may effectively reduce the amounts of gas molecules potentially released into operating environments of electronic components (e.g., microelectromechanical systems components) in semiconductor devices. Therefore, satisfactory performance of the electronic components may be attained. Advantageously, satisfactory quality of the semiconductor devices and a satisfactory yield of the related manufacturing process may be substantially attained.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing semiconductor device, the method comprising:
   performing an etching process to remove a sacrificial layer from a first composite structure, wherein the first composite structure includes a first substrate structure;
   performing a heat treatment to release a gas from the first composite structure;
   performing a cleaning process to remove an oxide layer from the first composite structure; and
   combining the first composite structure with a second composite structure that includes a second substrate structure and an electronic component positioned on the second substrate structure, such that the first substrate structure is combined with the second substrate structure to form an enclosure structure that encloses the electronic component.

2. The method of claim 1, wherein the heat treatment is performed after the etching process.

3. The method of claim 1, wherein the heat treatment is performed before the cleaning process.

4. The method of claim 1, wherein the heat treatment is performed at a temperature in a range of 280 degrees Celsius to 320 degrees Celsius.

5. The method of claim 1, wherein the heat treatment is performed at 300 degrees Celsius.

6. The method of claim 1, wherein the heat treatment is performed at a temperature that enables a quality factor value of the semiconductor device to be greater than or equal to 18000.

7. The method of claim 1, wherein the heat treatment is performed for a time length in a range of 15 hours to 25 hours.

8. The method of claim 1, wherein the heat treatment is performed for 20 hours.

9. The method of claim 1, wherein the heat treatment is performed for a time length that enables a quality factor value of the semiconductor device to be greater than or equal to 18000.

10. The method of claim 1, comprising:
positioning the first composite structure inside a container to perform the heat treatment; and
extracting the gas from the container during the heat treatment.

11. The method of claim 10, comprising:
removing the first composite structure from the container after the heat treatment, wherein a pressure inside the container is in a range of 3 kPa to 50 kPa before the first composite structure is removed from the container.

12. The method of claim 10, comprising:
removing the first composite structure from the container after the heat treatment, wherein a pressure inside the container is in a range of 3 kPa to 50 kPa when the first composite structure is removed from the container.

13. The method of claim 1, comprising:
positioning the first composite structure in a container to perform the heat treatment; and extracting hydroxide molecules from the container during the heat treatment, wherein the gas includes the hydroxide molecules.

14. The method of claim 1, comprising:
positioning the first composite structure in a container to perform the heat treatment; and extracting nitrogen molecules from the container during the heat treatment, wherein the gas includes the nitrogen molecules.

15. The method of claim 1, comprising:
positioning the first composite structure in a container to perform the heat treatment; and extracting hydrogen molecules from the container during the heat treatment, wherein the gas includes the hydrogen molecules.

16. The method of claim 1, comprising:
positioning the first composite structure in a container to perform the heat treatment; and extracting water molecules from the container during the heat treatment, wherein the gas includes the water molecules.

17. The method of claim 1, wherein the first composite structure includes a getter positioned on the first substrate structure and configured for absorbing gas molecules, wherein the heat treatment is performed on both the getter and the first substrate structure, and wherein the getter overlaps the electronic component after the enclosure structure has been formed.

18. The method of claim 1, wherein the first composite structure includes a titanium member positioned on the first substrate structure, wherein the heat treatment is performed on both the titanium member and the first substrate structure, and wherein the titanium member overlaps the electronic component after the enclosure structure has been formed.

* * * * *